(12) United States Patent
Oh et al.

(10) Patent No.: US 12,415,235 B2
(45) Date of Patent: Sep. 16, 2025

(54) DEPOSITION MASK MANUFACTURING APPARATUS

(71) Applicant: Samsung Display Co., Ltd., Yongin-si (KR)

(72) Inventors: Taekil Oh, Yongin-si (KR); Gyoowan Han, Yongin-si (KR); Wonyong Kim, Yongin-si (KR); Seungho Myoung, Yongin-si (KR); Jaeseok Park, Yongin-si (KR); Alexander Voronov, Yongin-si (KR); Jinhong Jeun, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 304 days.

(21) Appl. No.: 17/838,243

(22) Filed: Jun. 12, 2022

(65) Prior Publication Data

US 2022/0297236 A1    Sep. 22, 2022

Related U.S. Application Data

(62) Division of application No. 15/973,462, filed on May 7, 2018, now Pat. No. 11,358,240.

(30) Foreign Application Priority Data

Oct. 11, 2017    (KR) .................. 10-2017-0131642

(51) Int. Cl.
    *B23K 26/362*    (2014.01)
    *B23K 26/06*     (2014.01)
    (Continued)

(52) U.S. Cl.
    CPC ........ *B23K 26/362* (2013.01); *B23K 26/0626* (2013.01); *B23K 26/0673* (2013.01);
    (Continued)

(58) Field of Classification Search
    None
    See application file for complete search history.

(56) References Cited

U.S. PATENT DOCUMENTS

| 8,455,790 B2 | 6/2013 | Tanaka et al. |
| 8,680,430 B2 | 3/2014 | Unrath |

(Continued)

FOREIGN PATENT DOCUMENTS

| CN | 102094167  | 6/2011 |
| CN | 103658978  | 3/2014 |

(Continued)

OTHER PUBLICATIONS

KR 2015-0035131 (Lee, Do-hyung) Apr. 6, 2015 [retrieved on Jun. 15, 2024]. Retrieved from Foreign Image and Text database, translation by Clarivate Analytics. (Year: 2015).*

(Continued)

*Primary Examiner* — John J Norton
(74) *Attorney, Agent, or Firm* — CANTOR COLBURN LLP (57) ABSTRACT

An apparatus for manufacturing a deposition mask including a stage on which a mask substrate is mounted, a light source configured to irradiate a laser beam, a beam splitter configured to split the irradiated laser beam into a plurality of laser beams, a scanner configured to simultaneously scan the plurality of laser beams onto the mask substrate, and a tuner configured to finely change irradiation states of the plurality of laser beams to correspond to shapes of a plurality of pattern holes, while the plurality of laser beams are scanned.

18 Claims, 10 Drawing Sheets

(51) Int. Cl.

| | | |
|---|---|---|
| *B23K 26/067* | (2006.01) | |
| *B23K 26/082* | (2014.01) | |
| *B23K 26/382* | (2014.01) | |
| *C22C 38/08* | (2006.01) | |
| *H01L 21/027* | (2006.01) | |
| *H01L 21/033* | (2006.01) | |
| *H10K 71/00* | (2023.01) | |
| *H10K 71/16* | (2023.01) | |
| *B23K 103/02* | (2006.01) | |
| *G03F 1/00* | (2012.01) | |

(52) U.S. Cl.
CPC ........ *B23K 26/0676* (2013.01); *B23K 26/082* (2015.10); *B23K 26/382* (2015.10); *C22C 38/08* (2013.01); *H01L 21/0275* (2013.01); *H01L 21/0337* (2013.01); *H10K 71/00* (2023.02); *H10K 71/166* (2023.02); *B23K 2103/02* (2018.08); *G03F 1/00* (2013.01)

(56) References Cited

U.S. PATENT DOCUMENTS

| | | | |
|---|---|---|---|
| 9,259,805 | B2 | 2/2016 | Kim et al. |
| 9,377,681 | B2 | 6/2016 | Lee et al. |
| 9,457,426 | B2 | 10/2016 | Lee et al. |
| 9,592,570 | B2 | 3/2017 | Lee et al. |
| 9,643,280 | B2 | 5/2017 | Lee et al. |
| 10,160,000 | B2 | 12/2018 | Hirobe et al. |
| 10,377,096 | B2 | 8/2019 | Wildsmith et al. |
| 10,507,544 | B2 | 12/2019 | Zhang et al. |
| 2006/0203214 | A1 | 9/2006 | Shiraishi |
| 2007/0138151 | A1 | 6/2007 | Tanaka et al. |
| 2011/0183271 | A1 | 7/2011 | Lee et al. |
| 2014/0076869 | A1 | 3/2014 | Lee et al. |
| 2014/0177055 | A1 | 6/2014 | Lee et al. |
| 2014/0238963 | A1 | 8/2014 | Jo et al. |
| 2014/0291306 | A1 | 10/2014 | Lee et al. |
| 2015/0001194 | A1 | 1/2015 | Unrath et al. |
| 2015/0104608 | A1 | 4/2015 | Lee et al. |
| 2016/0145762 | A1 | 5/2016 | Im et al. |
| 2016/0151114 | A1 | 6/2016 | Gu et al. |
| 2016/0250714 | A1 | 9/2016 | Zhang et al. |
| 2019/0259950 | A1 | 8/2019 | Jung et al. |

FOREIGN PATENT DOCUMENTS

| | | |
|---|---|---|
| CN | 103962719 | 8/2014 |
| CN | 104002041 | 8/2014 |
| CN | 104053813 | 9/2014 |
| JP | 2017-144465 | 8/2017 |
| KR | 10-2008-0085873 | 9/2008 |
| KR | 10-2011-0102319 | 9/2011 |
| KR | 10-2013-0127981 | 11/2013 |
| KR | 10-2014-0036593 | 3/2014 |
| KR | 10-2014-0043524 | 4/2014 |
| KR | 10-2014-0064475 | 5/2014 |
| KR | 10-2014-0118537 | 10/2014 |
| KR | 10-2015-0035131 | 4/2015 |
| TW | 201637764 | 11/2016 |
| TW | 201639651 | 11/2016 |
| WO | 2015093304 | 6/2015 |

OTHER PUBLICATIONS

Non-Final Office Action dated Apr. 29, 2020, issued to U.S. Appl. No. 15/973,462.

Final Office Action dated Aug. 27, 2020, issued to U.S. Appl. No. 15/973,462.

Non-Final Office Action dated Dec. 28, 2020, issued to U.S. Appl. No. 15/973,462.

Final Office Action dated May 19, 2021, issued to U.S. Appl. No. 15/973,462.

Notice of Allowance dated Feb. 16, 2022, issued to U.S. Appl. No. 15/973,462.

Office Action dated Dec. 2, 2022, issued to Chinese Patent Application No. 201811175880.0 (with English Concise Explanation).

* cited by examiner

DEPOSITION MASK MANUFACTURING APPARATUS

CROSS-REFERENCE TO RELATED APPLICATIONS

This application is a divisional of U.S. patent application Ser. No. 15/973,462, filed on May 7, 2018, which issued as U.S. Pat. No. 11,358,240 on Jun. 22, 2022, which claims priority from and the benefit of Korean Patent Application No. 10-2017-0131642, filed on Oct. 11, 2017, each of which is hereby incorporated by reference for all purposes as if fully set forth herein.

BACKGROUND

Field

Exemplary embodiments of the invention relate generally to a method of manufacturing a deposition mask that includes an improved process of forming a pattern hole of a mask used for deposition, and, more specifically, to an apparatus for manufacturing a deposition mask.

Discussion of the Background

In general, an organic light-emitting display device implements colors based on the principle in which holes and electrons injected from an anode and a cathode recombine in an emission layer, and pixels have a structure in which the emission layer is between a pixel electrode that is an anode and an opposite electrode that is a cathode.

Each pixel may be a sub-pixel of any one of, for example, a red pixel, a green pixel, and a blue pixel, and due to a color combination of the above three pixels, a desired color may be produced. That is, each sub-pixel has a structure in which an emission layer is between two electrodes, the emission layer emitting light of any one of a red color, a green color, and a blue color. Due to a combination of light of three colors, a color of one unit pixel is produced.

The electrodes, the emission layer, and the like of the above organic light-emitting device may be formed by deposition. That is, a mask, which has pattern holes having the same pattern as a thin film to be formed, is located on a substrate, and a raw material of the thin film is deposited on the substrate through the pattern holes in the mask, thereby forming a thin film having a desired pattern. The mask is often used as a mask frame assembly together with a frame that supports end portions of the mask, and the pattern holes are usually formed during an etching process using photoresist.

However, when pattern holes of the mask are formed during an etching process, it is difficult to form pattern holes having highly precise dimensions. In addition, since etching generally starts from both side surfaces of a mask towards an inner portion thereof such that etched portions meet around a middle thickness to thereby form pattern holes, working speed is greatly low, and non-continuous protruding surfaces appear around the middle thickness at which the etching portions meet, which may result in disturbance of accurate patterning that is so-called 'shadow' during deposition.

The above information disclosed in this Background section is only for understanding of the background of the inventive concepts, and, therefore, it may contain information that does not constitute prior art.

SUMMARY

One or more exemplary embodiments include a method of manufacturing a deposition mask which is improved to accurately and quickly form pattern holes in a mask without performing an etching process, and an apparatus for manufacturing a deposition mask.

Additional aspects will be set forth in part in the description which follows and, in part, will be apparent from the description, or may be learned by practice of the presented embodiments.

According to one or more exemplary embodiments, a method of manufacturing a deposition mask includes: a preparing process in which a mask substrate is located on a stage; and a hole processing process in which laser beams are irradiated onto the mask substrate to form a plurality of pattern holes. The hole processing process includes: an irradiation process in which a light source irradiates a laser beam; a splitting process in which the irradiated laser beam is split into a plurality of laser beams; a scanning process in which the plurality of laser beams are simultaneously scanned onto the mask substrate; and a tuning process in which irradiation states of the plurality of laser beams are finely changed to correspond to shapes of the plurality of pattern holes while the plurality of laser beams are scanned.

According to one or more exemplary embodiments, an apparatus for manufacturing a deposition mask, includes: a stage on which a mask substrate is mounted; a light source configured to irradiate a laser beam; a beam splitter configured to split the irradiated laser beam into a plurality of laser beams; a scanner configured to simultaneously scan the plurality of laser beams onto the mask substrate; and a tuner configured to finely change irradiation states of the plurality of laser beams to correspond to shapes of a plurality of pattern holes, while the plurality of laser beams are scanned.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

In the following description, for the purposes of explanation, numerous specific details are set forth in order to provide a thorough understanding of various exemplary embodiments or implementations of implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1:
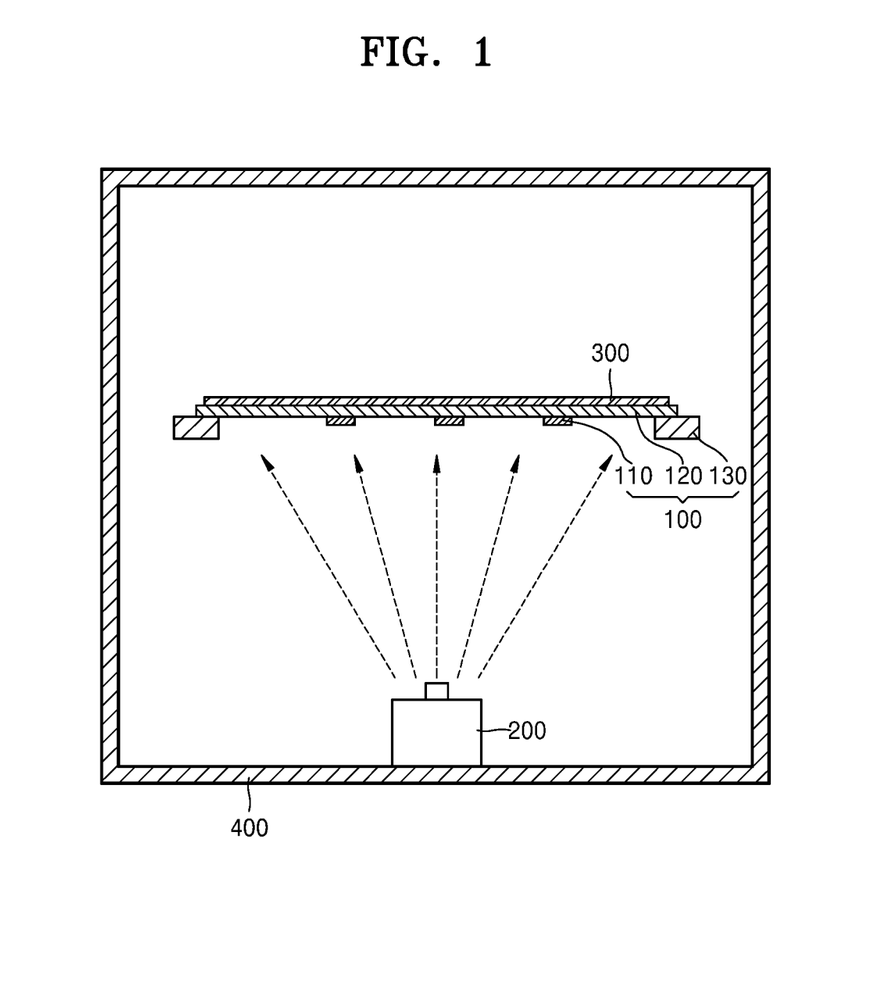
FIG. 1 illustrates a deposition process using a deposition mask manufactured according to an exemplary embodiment.

FIG. 1 schematically illustrates a structure of a thin film deposition apparatus including a deposition mask 120, according to an exemplary embodiment.

As illustrated, the thin film deposition apparatus may include the deposition mask 120 forming a desired pattern on a target substrate 300 and a deposition source 200 discharging a deposition gas towards the target substrate 300 within a chamber 400.

Thus, when the deposition source 200 discharges the deposition gas within the chamber 400, the discharged deposition gas may pass through pattern holes 121 (refer to FIG. 2) in the deposition mask 120 and adhere to the target substrate 300, thereby forming a thin film having a certain pattern.

Figure 2:
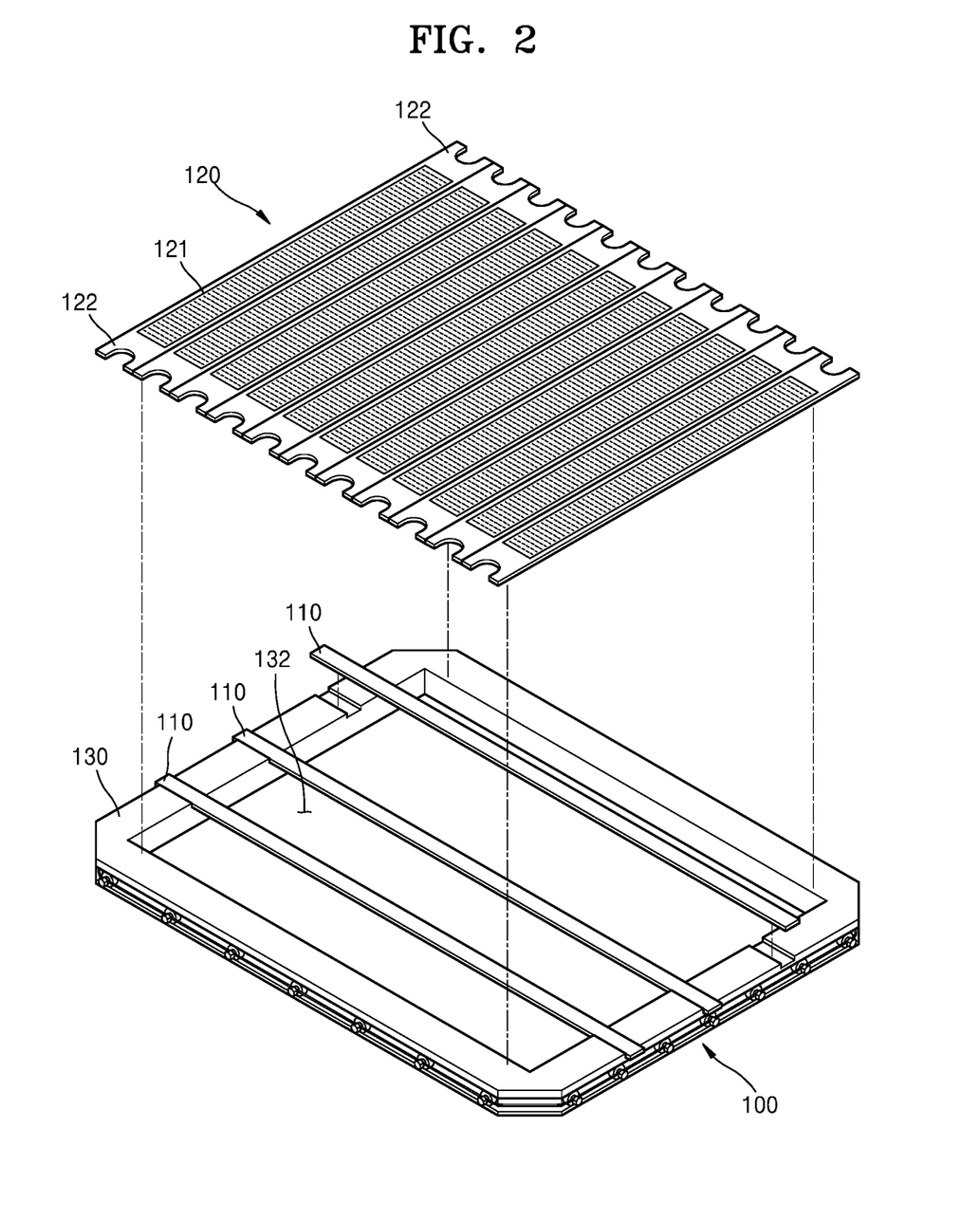
FIG. 2 is an exploded perspective view of a mask frame assembly including the deposition mask of FIG. 1.

As illustrated in FIG. 2, the deposition mask 120 may be used as a mask frame assembly 100, including a frame 130 supporting both end portions of the deposition mask 120 and long-side sticks 110 crossing the deposition masks 120 and supported on the frame 130.

That is, the mask frame assembly 100 may include the frame 130, the long-side sticks 110 each having both end portions fixed to the frame 130, and the deposition masks 120 perpendicularly crossing the long-side sticks 110 and each having both end portions fixed to the frame 130.

The frame 130 may form an outer peripheral shape of the mask frame assembly 100 and have a rectangular shape having an opening 132 at the center thereof. The end portions of the long-side sticks 110 may be welded and fixed to a pair of sides of the frame 130 which face each other, and both end portions of the deposition mask 120 may be welded and fixed to another pair of sides of the frame 130 which are perpendicular to the above pair of sides.

The deposition masks 120 may be members having long stick shapes and have the pattern holes 121 disposed in the opening 132, and the end portions of the deposition mask 120 may be welded to the frame 130. The reference numeral 122 may denote clamping portions, and the clamping portions 122 may be stretched in a lengthwise direction of the deposition mask 120 when the deposition mask 120 is welded to the frame 130, and after the welding is completed, the clamping portions 122 may be cut and removed. The deposition mask 120 may be formed as one large deposition mask, but in that case, the large deposition mask may be sagged due to its own load. Thus, as illustrated in the drawings, the deposition mask 120 may be divided into multiple sticks. The deposition mask 120 may include an iron (Fe)-nickel (Ni) alloy that has about 36% nickel and about 64% iron. Put another way, the deposition mask 120 may include 64FeNi or Invar.

The pattern holes 121 may be holes through which a deposition gas passes during a deposition process, and the deposition gas having passed through the pattern holes 121 may adhere to the target substrate 300 (see FIG. 1) to thereby form a thin film.

Areas of the pattern holes 121 may not be divided in units of cells having certain sizes, but connected into one pattern hole 121. The long-side sticks 110 may divide the areas of the pattern holes 121 in units of cells. That is, as illustrated in the drawings, the deposition mask 120 and the long-side stick 110 may perpendicularly cross and adhere to each other on the frame 130, and accordingly, the long-side sticks 110 cross the areas of the pattern holes 121 in the deposition mask 120 and divide the same in units of cells. In other words, the long-side sticks 110 may draw boundary lines between unit cells.

Figure 3:
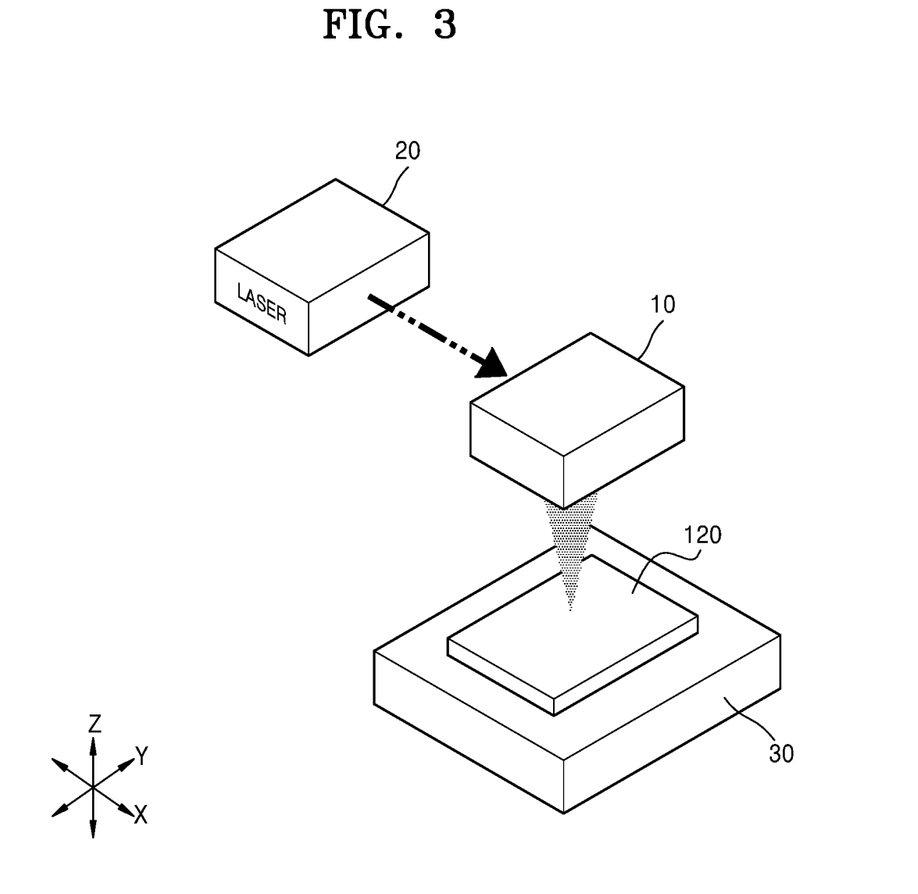
FIG. 3 is a perspective view of an apparatus for manufacturing a deposition mask, according to an exemplary embodiment.
Figure 4:
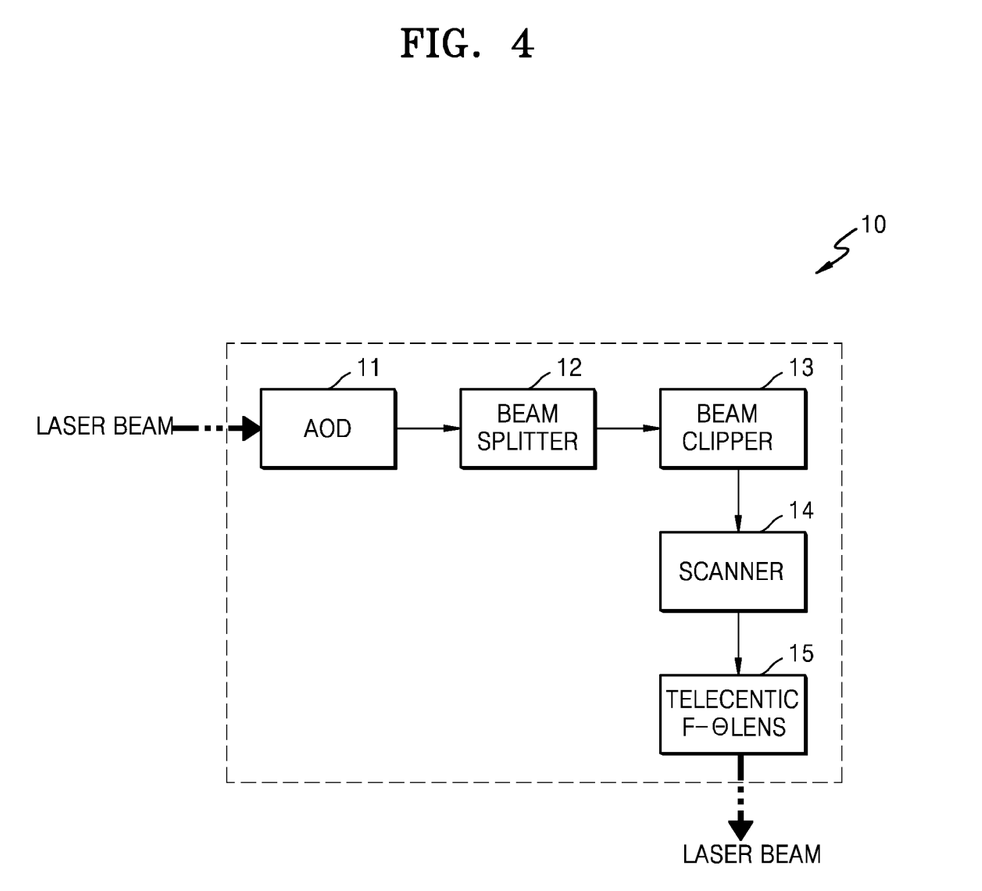
FIG. 4 is a block diagram of a schematic structure of an optical system of FIG. 3.

The pattern holes 121 in the deposition mask 120 may be formed by an apparatus illustrated in FIGS. 3 and 4. Although a structure of the apparatus is schematically illustrated, the structure is not limited thereto. That is, in addition to the components illustrated in FIGS. 3 and 4, the apparatus may further include components such as various mirrors, lenses, or a correction optical system, and when the components perform functions to be described below, an arrangement order of the components may vary.

A mask substrate 120 (has the same reference numeral as the deposition mask 120 because, as soon as the pattern holes 121 are formed, the mask substrate 120 becomes the deposition mask 120), in which the pattern holes 121 are to be formed, may be mounted on a stage 30, and the stage 30 may support the mask substrate 120 during the formation of the pattern holes 121 and allow the mask substrate 120 to move at certain pitches in a Y-axis direction.

A light source 20 may emit pulse laser beams used to form the pattern holes 121, and an optical system 10 may adjust the emitted laser beams to satisfy optimum conditions for forming the pattern holes 121.

With regard to components included in the optical system 10, as illustrated in FIG. 4, there may be a tuner 11 that finely adjusts a location, power, and the number of irradiations of a laser beam, a beam splitter 12 that splits the laser beam emitted from the light source 20 into multiple laser beams, a beam clipper 13 that selectively hides some of the split laser beams and adjusts the number of laser beams, a scanner 14 that scans the laser beams onto the mask substrate 120 in an X-axis direction of FIG. 3, a telecentric F-θ lens 15 that adjusts incidence angles of the laser beams to allow the laser beams to be perpendicularly incident to the mask substrate 120, and the like.

Functions of the beam splitter 12 will be described first. As described above, the beam splitter 12 may split the light emitted from the light source 20 into laser beams. That is, the beam splitter 12 may increase the number of laser beams in such a manner that multiple laser beams, instead of a single laser beam, may be simultaneously irradiated onto the mask substrate 120.

Figure 5:
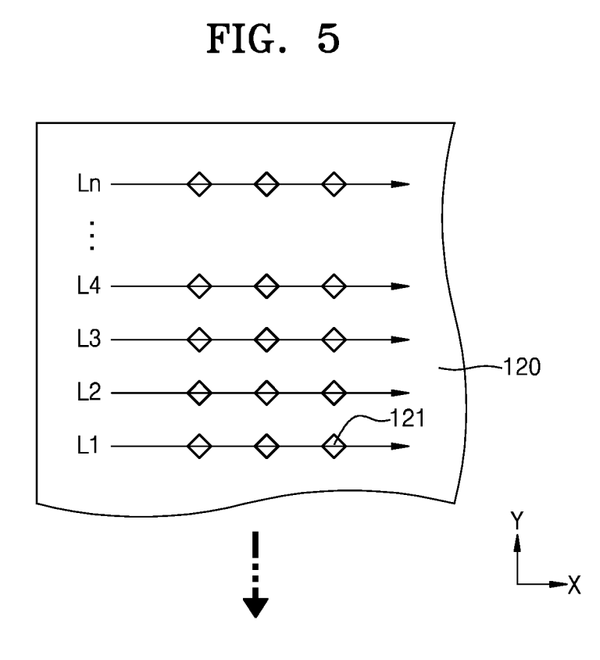
FIG. 5 is a plan view of a process of scanning laser beams in the apparatus of FIG. 3.

When the increased number of laser beams is scanned by the scanner 14, laser beams L1 to Ln illustrated in FIG. 5 may simultaneously pass a surface of the mask substrate 120 in an X-axis direction. Thus, multiple columns of pattern holes 121 may be formed.

The beam clipper 13 may decrease the increased number of laser beams, according to necessity. For example, when it is assumed that the beam splitter 12 splits a laser beam into ten laser beams and there are, on the mask substrate 120, seventeen columns in which the pattern holes 121 are to be formed, all the ten laser beams are scanned onto first to tenth columns to form the pattern holes 121, but when the pattern holes 121 are to be formed in eleventh to seventeenth columns as the stage 30 is moved at a certain pitch, only seven laser beams have to be used. In this case, the beam clipper 13 hides and blocks the rest of the three laser beams.

The scanner 14 may include a Galvano mirror or a polygon mirror, and may scan the laser beams on the mask substrate 120 in the X-axis direction, and when the laser beams are irradiated, the telecentric F-θ lens 15 may adjust the incidence angles in such a manner that the laser beams from a central portion as well as the laser beams from edge portions may be perpendicularly incident onto the mask substrate 120.

The tuner 11 may use an Acousto-Optic Deflector (AOD) and quickly change fine states of the laser beams, for example, locations, power, the number of irradiations thereof, and the like. Since the tuner 11 may be placed before the beam splitter 12, the laser beam emitted from the light source 20 may be finely adjusted, and the laser beams split by the beam splitter 12 may move according to the finely adjusted laser beam.

Figure 6:
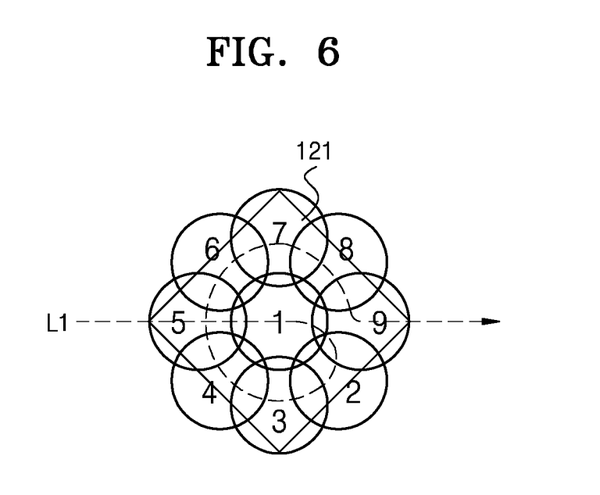
FIG. 6 is a plan view illustrating a movement path of a laser beam in each pattern hole during a scanning process of FIG. 5.

A first fine adjustment target may be a movement path of the laser beams within the areas of the pattern holes 121. Referring to FIGS. 5 and 6, the laser beams L1 to Ln may be uniformly moved by the scanner 14 in the X-axis direction without stopping. While moved, the laser beams L1 to Ln may pass the areas of the pattern holes 121, and as illustrated in FIG. 6, the laser beam L1 may spirally circle once from a point 1 to a point 9 in the area of each pattern hole 121, and then pass. This quick and fine adjustment may be performed by the tuner 11. That is, a relatively slow movement of the laser beam L1 in a scanning direction may be conducted by the scanner 14, and a movement, which is faster by several tens of times within the area of each pattern hole 121, may be adjusted by the tuner 11. Here, the pattern hole 121 may have a rhomboid shape, and the tuner 11 may finely adjust the path to allow the laser beam L1 to be irradiated onto the entire area of the pattern hole 121 having a rhomboid shape.

A second fine adjustment target may be the number of irradiations. While being scanned as illustrated in FIG. 5, the laser beams L1 to Ln may not always be "on," but may only be "on" only in areas of the pattern holes 121 to be processed. Also, the laser beam L1 may not continuously be "on" in the areas of the pattern hole 121, but may only be "on" only in nine points from the point 1 to the point 9, as illustrated in FIG. 6. Nine irradiations are not absolute, but when irradiating the laser beams, nine times may be enough to cover the entire area of the pattern hole 121 to form the pattern holes 121 having a rhomboid shape. The tuner 11 may adjust the path and a timing when the laser beam is "on" and control the laser beam L1 such that the laser beam L1 circles and passes the pattern holes 121 having a rhomboid shape while being turned "on." The irradiation numbers of the laser beam L1 may decrease as the pattern holes 121 decreases in size, which will be described again together with a process of forming a taper of the pattern holes 121.

A third fine adjustment target may be the power of the laser beams, and in the present embodiment, power of the laser beams may be maintained to a certain degree. That is, when the pattern holes 121 decrease in size, power of laser beams may decrease instead of decreasing the number of irradiations, but in the present disclosure, the power is maintained to a certain level, and the number of irradiations may decrease.

The tuner 11 may adjusts the fine movement path, the number of irradiations, and the power of the laser beams.

Processes of manufacturing the deposition mask 120 by using a deposition mask manufacturing apparatus will be described below, and examples of the target substrate 300 that may be deposited by using the deposition mask 120 will be briefly provided.

The deposition mask 120 may be used to deposit various thin films, for example, patterns of an emission layer of an organic light-emitting display apparatus.

Figure 8:
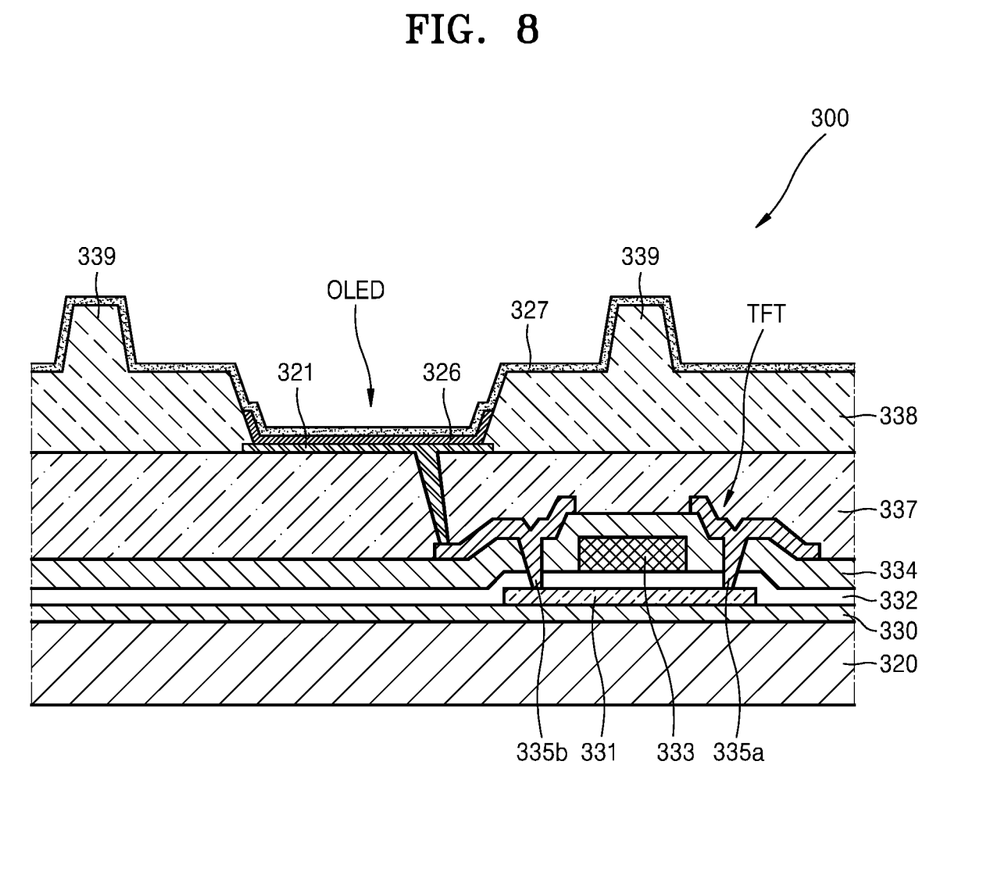
FIG. 8 is a cross-sectional view of a detailed structure of a target substrate of FIG.

FIG. 8 illustrates a structure of the organic light-emitting display apparatus as an example of the target substrate 300 on which a thin film may be deposited by using the deposition mask 120.

Referring to FIG. 8, a buffer layer 330 is formed on a base plate 320, and a thin film transistor TFT is above the buffer layer 330.

The thin film transistor TFT may include an active layer 331, a gate insulating layer 332 covering the active layer 331, and a gate electrode 333 on the gate insulating layer 332.

An interlayer insulating layer 334 may cover the gate electrode 333, and a source electrode 335a and a drain electrode 335b may be formed on the interlayer insulating layer 334.

The source electrode 335a and the drain electrode 335b may respectively contact a source area and a drain area of the active layer 331 through contact holes in the gate insulating layer 332 and the interlayer insulating layer 334.

A pixel electrode 321 of an organic light-emitting diode OLED may be connected to the drain electrode 335b. The pixel electrode 321 may be formed on a planarization layer 337, and on the pixel electrode 321, a pixel-defining layer 338 that divides sub-pixel areas may be formed. The reference numeral 339 indicates spacers that maintain a gap between the target substrate 300 and the deposition mask 120 during deposition and prevent damage to members of the target substrate 300 due to contact of the deposition mask 120. The spacers 339 may protrude from portions of the pixel-defining layer 338. An emission layer 326 of the organic light-emitting diode OLED may be formed in the opening of the pixel-defining layer 338, and an opposite layer 327 may be deposited on the emission layer 326. That is, the opening surrounded by the pixel-defining layer 338 may become an area of a sub-pixel such as a red pixel R, a green pixel G, or a blue pixel B, and the emission layer 326 emitting a corresponding color may be formed in the opening.

Therefore, for example, when the deposition mask 120 is prepared to make the pattern hole 121 correspond to the emission layer 326; the emission layer 326 having a desired pattern may be formed during the deposition process described above with reference to FIG. 1. The above-described unit cell may correspond to a display area of the organic light-emitting display apparatus.

A process of forming the pattern holes 121 of the deposition mask 120 that may form the organic light-emitting display apparatus will be described with reference to FIGS. 3, 4, and 7A to 7D. As illustrated in FIG. 7D, the pattern holes 121 are formed in tapered shapes, that is, shapes in which the areas of the pattern holes 121 continuously decrease from surfaces to which laser beams are irradiated to opposite surfaces.

As illustrated in FIG. 3, when the mask substrate 120 is prepared after being mounted on the stage 30, a hole processing process is performed as the light source 20 emits the laser beam and the optical system 10 adjusts the laser beam, as described above.

Figure 7A:
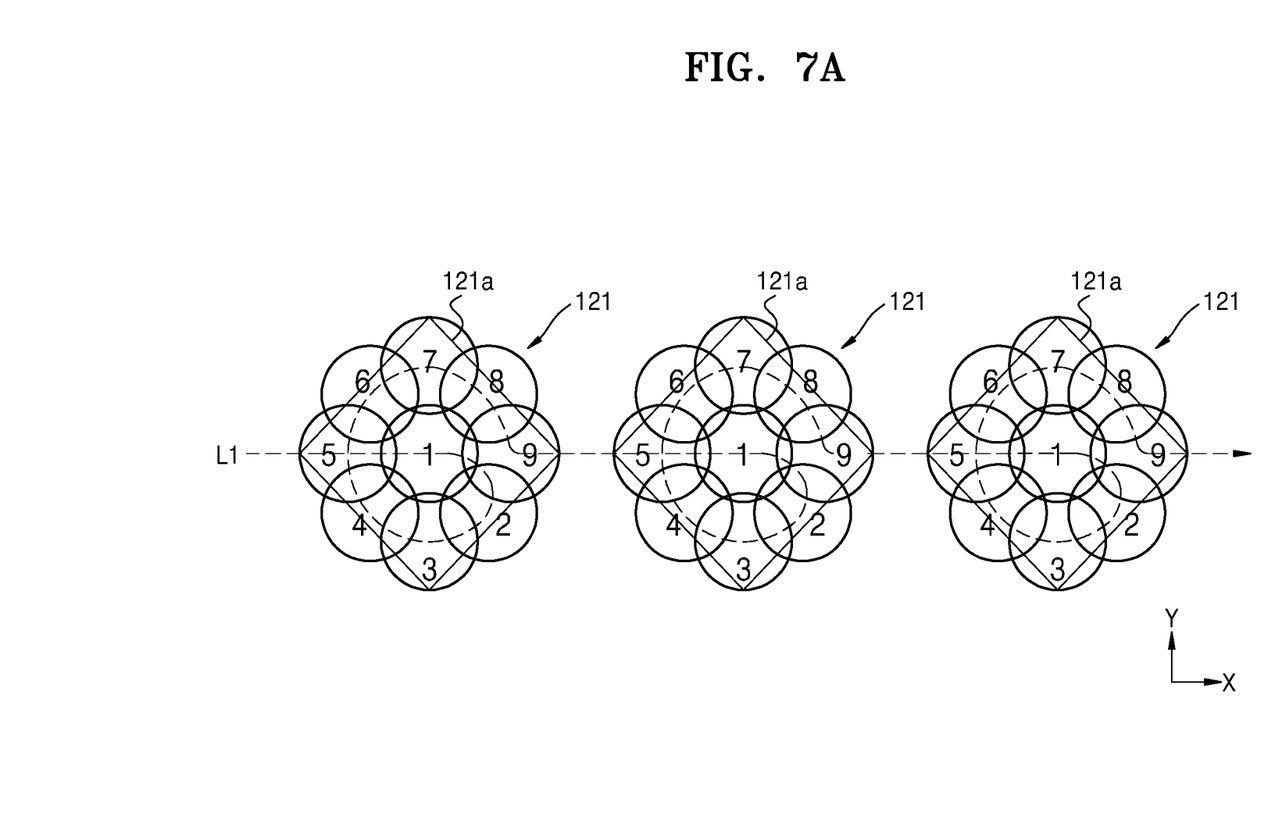
FIGS. 7A, 7B, 7C, and 7D are plan views illustrating processes of manufacturing a deposition mask, according to an exemplary embodiment.
Figure 7B:
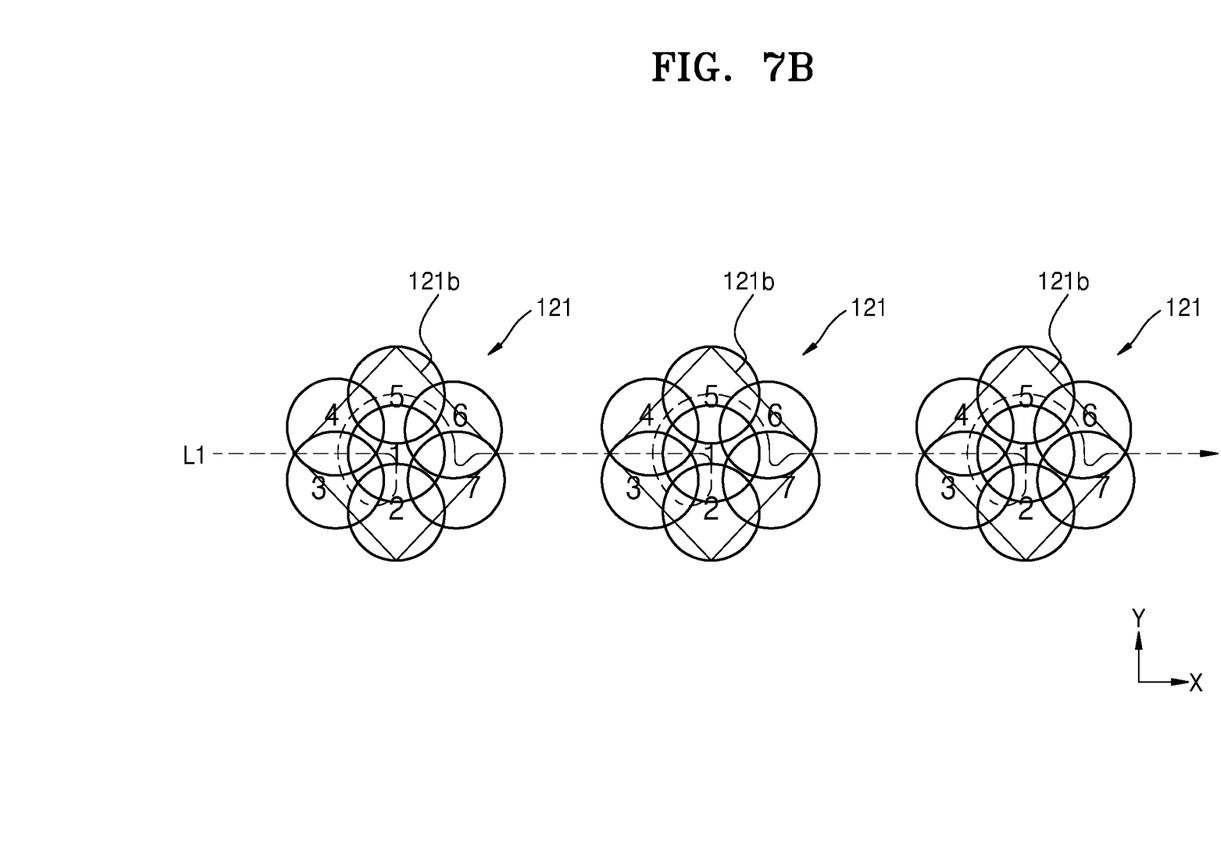
Figure 7C:
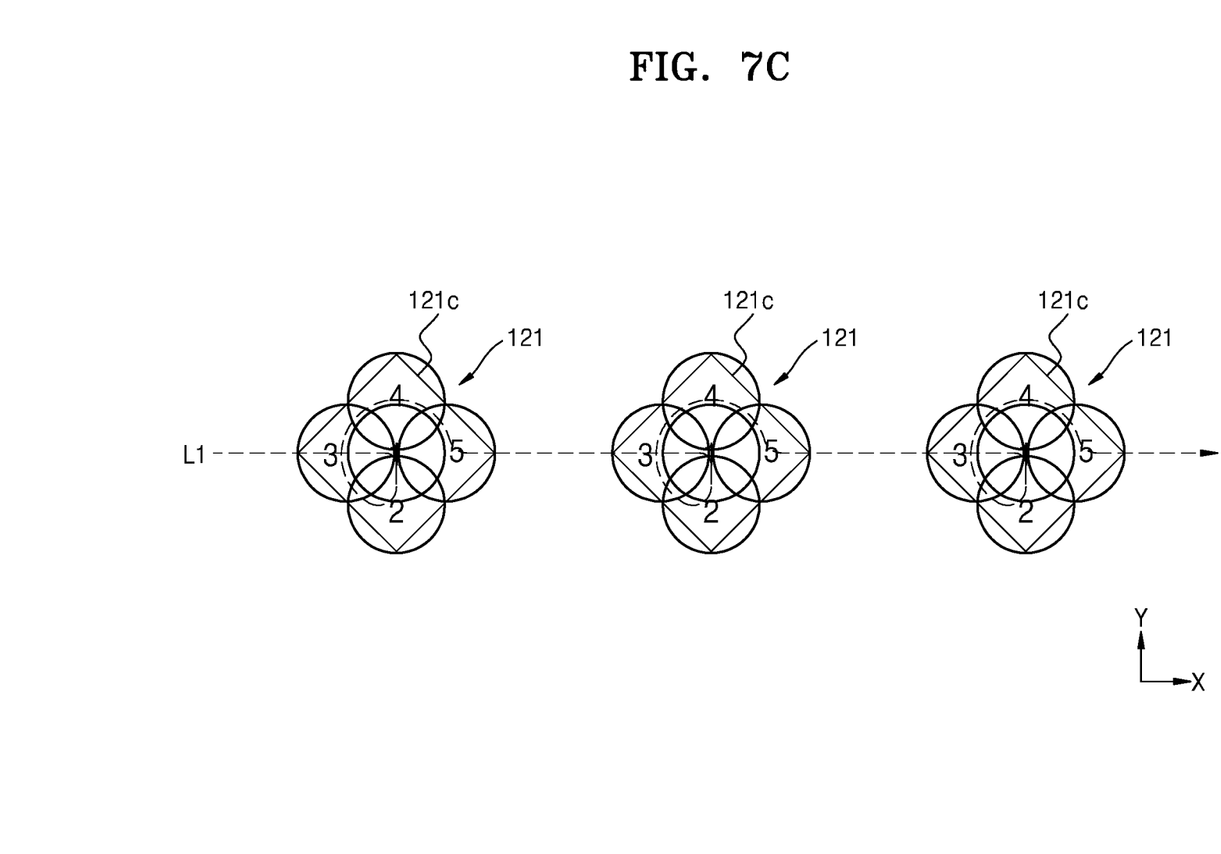
Figure 7D:
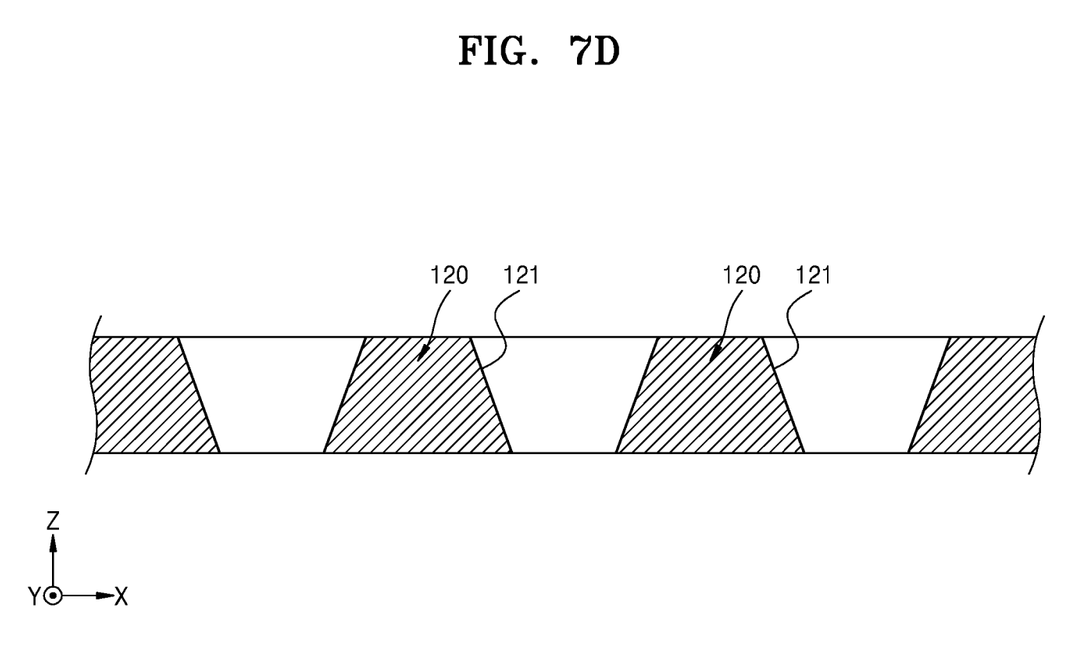

FIGS. 7A, 7B, and 7C illustrate a process in which one laser beam L1 among the laser beams L1 to Ln passes, and the other laser beams L2 to Ln also pass in the same path.

FIG. 7A illustrates a first scanning process. The laser beam L1 may be moved along a scan path in an X-axis direction, and as the laser beam L1 spirally circles according to the control of the tuner 11 in the areas of each pattern hole 121 and is irradiated nine times, holes 121a having a rhombus shape may be formed. The holes 121a may not immediately become the pattern holes 121 that are thoroughly penetrated, and may have a certain depth in a surface layer. When power of a laser beam increases, the pattern holes 121 may be formed at once, but in the present disclosure, the pattern holes 121 need to have tapered shapes and thus are gradually processed from the surface layer.

As illustrated in FIG. 7B, second scanning is performed, and at this time, sizes of holes 121b to be formed decrease compared to the holes 121a formed during the first scanning. As described above, the holes 121b that decrease in size for the tapered shapes may be formed. The tuner 11 may decrease the number of irradiations of the laser beam L1 to seven, in relation to the decreased size of the holes 121b. That is, the number of irradiations decreases to prevent energy from being excessively input to small areas.

During third scanning of FIG. 7C, the laser beam L1 may be irradiated to form holes 121c that are smaller than the holes 121b, and thus, the number of irradiations may be reduced to five.

As described, when scanning is repeatedly performed by gradually decreasing sizes of target holes as well as the number of irradiations, the pattern holes 121 having tapered shapes may be formed as illustrated in FIG. 7D.

Then, for example, when the pattern holes 121 are formed in the first to tenth columns on the mask substrate 120 by using ten laser beams, the stage 30 is moved at certain pitches, and pattern holes 121 are formed in eleventh to twentieth columns. However, when the pattern holes 121 need to be formed from the first column to the seventeenth column, the beam clipper 13 may block the rest of the three laser beams, and the pattern holes 121 may be formed in the eleventh to seventeenth columns.

By using the above-described processes, the mask substrate 120 may be gradually etched from one surface, compared to a case where the mask substrate 120 is etched from both side surfaces thereof and the etched portions meet in the middle of the mask substrate 120. Thus, no protruding surfaces may be formed at a middle thickness portion of the pattern holes 121, and multiple laser beams may be controlled and directly irradiated onto the mask substrate 120 to form the pattern holes 121 in multiple columns such that accurate and quick processing of the pattern holes 121 may be enabled.

Consequently, when the pattern holes 121 of the deposition mask 120 are formed by using the above method, a problem such as formation of protruding portions causing a shadow during an etching process may be solved, and the fine paths of the laser beams may be adjusted regardless of shapes of the pattern holes 121. Therefore, productivity and quality of a final product may be improved.

In the present embodiment, the pattern holes 121 are formed in the deposition mask 120 that is divided into multiple sticks, but the present embodiment may be applied to an integrated mask, in which one member covers the opening 132 of the frame 130, or a mask in which the pattern holes 121 are divided in units of cells in the deposition mask 120 without the long-side sticks 110. In other words, when the pattern holes 121 are formed by directly irradiating laser beams, the apparatus and method of manufacturing a deposition mask of the present embodiment may be applied regardless of types of masks.

Therefore, according to the above-described apparatus and method of manufacturing a deposition mask, since pattern holes are formed by irradiating laser beams without performing an etching process, the pattern holes may be highly accurately formed. Also, even when multiple laser beams, which are split from one laser beam, are scanned without stopping, locations of the laser beams may be finely and quickly adjusted according to shapes of the pattern holes, and thus pattern holes having various shapes may be quickly and stably formed. As a result, productivity may be improved, and uniform quality of products may be secured.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An apparatus for manufacturing a deposition mask, the apparatus comprising:
    a stage on which a mask substrate is mounted;
    a light source configured to irradiate a laser beam;
    a beam splitter configured to split the irradiated laser beam into a plurality of laser beams;
    a scanner configured to simultaneously scan the plurality of laser beams onto the mask substrate; and
    a tuner configured to finely change irradiation states of the plurality of laser beams to correspond to shapes of a plurality of pattern holes while the plurality of laser beams are scanned,
    wherein
    the scanner is further configured to gradually form each of the plurality of pattern holes by allowing a corresponding one of the laser beams to pass an area of each of the plurality of pattern holes a plurality of times,
    the tuner is further configured to vary a number of irradiations of each laser beam in the area of each pattern hole each time the laser beam passes the area of the pattern hole, and
    the tuner is further configured to vary a location of each of the number of irradiations of the laser beam for any given one of the laser beam passes.

2. The apparatus of claim 1, wherein the tuner comprises an Acousto-Optic Deflector (AOD).

3. The apparatus of claim 2, the tuner is further configured to gradually decrease an area where the laser beam is irradiated within the area of the one pattern hole with each subsequent time the laser beam passes the area of the pattern hole.

4. The apparatus of claim 3, wherein each of the plurality of pattern holes has a tapered shape in which an open area gradually decreases from a side where the laser beam is irradiated to an opposite side.

5. The apparatus of claim 3, wherein the tuner gradually decreases the area covered by the number of irradiations of the laser beam for each subsequent pass by decreasing the number or irradiations of the laser beam for each pass.

6. The apparatus of claim 1, wherein the tuner further adjusts power of the laser beam within areas of the plurality of pattern holes.

7. The apparatus of claim 1, further comprising a beam clipper configured to block some of the plurality of laser beams to decrease a number of laser beams that are irradiated onto the mask substrate.

8. The apparatus of claim 1, further comprising a telecentric F-θ lens configured to adjust incidence angles of the plurality of laser beams to allow all of the plurality of laser beams to be perpendicularly incident to the mask substrate.

9. The apparatus of claim 1, wherein the stage is configured to move the mask substrate at a certain pitch in a direction perpendicular to a direction in which the plurality of laser beams are scanned.

10. The apparatus of claim 1, wherein the scanner comprises any one of a Galvano mirror and a polygon mirror.

11. The apparatus of claim 1, wherein the tuner is further configured to control each of the plurality of laser beams to spirally circle in an area corresponding to ones of the plurality of pattern holes to produce ones of the plurality of pattern holes.

12. The apparatus of claim 11, wherein the each of the plurality of pattern holes has a quadrangular shape in a plan view.

13. The apparatus of claim 1, wherein the scanner translates the laser beam linearly in a single direction.

14. The apparatus of claim 1, wherein a movement of the laser beam within an area of each of the plurality of pattern holes by the tuner is faster than a movement of the laser beam from one column to another column by the scanner.

15. The apparatus of claim 14, wherein the tuner moves the laser beam more than about 10 times faster than the scanner.

16. The apparatus of claim 1, wherein the tuner is further configured to:
   irradiate a center of one of the plurality of pattern holes and then around a first circumference of the pattern hole during a first pass, and
   irradiate the center of the pattern hole and then around a second circumference less than the first circumference during a second and subsequent pass of a same one of the plurality of pattern holes.

17. An apparatus for manufacturing a deposition mask, the apparatus comprising:
   a stage on which a mask substrate is mounted;
   a light source configured to irradiate a laser beam;
   a beam splitter configured to split the irradiated laser beam into a plurality of laser beams;
   a scanner configured to simultaneously scan the plurality of laser beams onto the mask substrate; and
   a tuner configured to finely change irradiation states of the plurality of laser beams to correspond to shapes of a plurality of pattern holes while the plurality of laser beams are scanned by adjusting a number of irradiations of the plurality of laser beams within the areas of the plurality of pattern holes, wherein the tuner is further configured to:
   irradiate a center of one of the plurality of pattern holes and then around a first circumference of the pattern hole during a first scanning,
   irradiate the center of the pattern hole and then around a second circumference less than the first circumference during a second and subsequent scanning of a same one of the plurality of pattern holes, and
   irradiate the center and then around a third circumference less than the second circumference during a third and subsequent scanning of the one of the plurality of pattern holes.

18. The apparatus of claim 17, wherein
a number of irradiations of the first scanning is 9,
a number of irradiations of the second scanning is 7, and
a number of irradiations of the third scanning is 5.

* * * * *